(12) United States Patent
Wang et al.

(10) Patent No.: US 9,337,435 B2
(45) Date of Patent: May 10, 2016

(54) DYE SENSITIZED SOLAR CELL

(75) Inventors: Peng Wang, Lausanne (CH); Shaik Mohammad Zakeeruddin, Renens (CH); Michael Graetzel, St-Sulpice (CH)

(73) Assignee: Ecole Polytechnique Federal de Lausanne (EPFL), Lausanne (CH)

( * ) Notice: Subject to any disclaimer, the term of this patent is extended or adjusted under 35 U.S.C. 154(b) by 1726 days.

(21) Appl. No.: 10/555,179

(22) PCT Filed: Apr. 29, 2004

(86) PCT No.: PCT/CH2004/000262
§ 371 (c)(1),
(2), (4) Date: Oct. 31, 2005

(87) PCT Pub. No.: WO2004/097871
PCT Pub. Date: Nov. 11, 2004

(65) Prior Publication Data
US 2008/0006322 A1    Jan. 10, 2008

(30) Foreign Application Priority Data
Apr. 30, 2003   (EP) .................................... 03405306

(51) Int. Cl.
| | | |
|---|---|---|
| H01L 51/42 | (2006.01) |
| B82Y 10/00 | (2011.01) |
| B82Y 30/00 | (2011.01) |
| H01G 9/20 | (2006.01) |
| H01L 51/00 | (2006.01) |

(52) U.S. Cl.
CPC ............. *H01L 51/4226* (2013.01); *B82Y 10/00* (2013.01); *B82Y 30/00* (2013.01); *H01G 9/2009* (2013.01); *H01G 9/2031* (2013.01); *H01L 51/0086* (2013.01); *H01L 51/0035* (2013.01); *Y02E 10/542* (2013.01); *Y02E 10/549* (2013.01)

(58) Field of Classification Search
USPC .......................................................... 136/263
See application file for complete search history.

(56) References Cited

U.S. PATENT DOCUMENTS

| | | | | |
|---|---|---|---|---|
| 5,463,057 A | * | 10/1995 | Graetzel et al. | 546/4 |
| 5,482,570 A | | 1/1996 | Saurer et al. | |
| 6,245,847 B1 | * | 6/2001 | Green et al. | 524/418 |

(Continued)

FOREIGN PATENT DOCUMENTS

| | | |
|---|---|---|
| EP | 0333641 | 1/1989 |
| EP | 0525070 | 2/1993 |

(Continued)

OTHER PUBLICATIONS

Sigma-Adrich MSDS for cis-Bis(isothiocyanato)(2,2'-bipyridyl-4,4'-dicarboxylato)(4,4'-di-nonyl-2'-bipyridyl)ruthenium(II) (Apr. 7, 2009).*

(Continued)

*Primary Examiner* — Jennifer Michener
*Assistant Examiner* — Dustin Q Dam
(74) *Attorney, Agent, or Firm* — Taft Stettinius & Hollister LLP

(57) ABSTRACT

A dye sensitized solar cell, wherein a compacting compound whose molecular structure comprises a terminal group, a hydrophobic part and an anchoring group is co-adsorbed together with the dye on the semi-conductive metal oxide layer of the photoanode, forming a dense mixed self-assembled monolayer.

18 Claims, 5 Drawing Sheets

(56) References Cited

U.S. PATENT DOCUMENTS

| | | | |
|---|---|---|---|
| 6,359,211 B1 * | 3/2002 | Spitler et al. | 136/263 |
| 6,376,765 B1 | 4/2002 | Wariishi et al. | |
| 6,911,595 B2 | 6/2005 | Yoshikawa et al. | |
| 2003/0152827 A1 * | 8/2003 | Ikeda et al. | 429/111 |
| 2004/0025934 A1 * | 2/2004 | Chittibabu et al. | 136/263 |
| 2004/0115524 A1 * | 6/2004 | Misra et al. | 429/160 |

FOREIGN PATENT DOCUMENTS

| | | |
|---|---|---|
| EP | 0737358 | 10/1996 |
| EP | 1052661 A2 * | 11/2000 |
| EP | 1087412 | 3/2001 |
| JP | 2001-345124 A | 12/2001 |
| JP | 2002-170602 A | 6/2002 |
| WO | WO 93/20569 | 10/1993 |
| WO | WO 02/11213 * | 2/2002 |
| WO | WO 02/071496 | 9/2002 |
| WO | WO 03/065394 | 8/2003 |

OTHER PUBLICATIONS

Wang et al. "A stable quasi-solid-state dye-sensitized solar cell with an amphiphilic ruthenium sensitizer and polymer gel electrolyte" Nature Materials vol. 2, pp. 402-407 (May 18, 2003).*

Zakeeruddin S M et al.: "Design, Synthesis, and Application of Amphiphilic Ruthenium Polypyridyl Photosensitizers in Solar Cells Based on Nanocrystalline TIO2 Films," Langmuir, ACS, Washington, DC, vol. 18, No. 3, Feb. 5, 2002, pp. 952-954.

Lagref J-J et al.: "Molecular Engineering on Semiconductor Surfaces . . . ," Synthetic Metals, Elsevier Sequoia, Lausanne, CH, vol. 138, No. 1/2, 2003, pp. 333-339.

Wang et al,; Enhance the Performance of Dye-Sensitized Solar Cells by Co-grafting Amphiphilic Sensitizer and Hexadecylmalonic Acid on TiO2 Nanocrystals; Laboratory for Photonics and Interfaces, Swiss Federal Institute of Technology; Sep. 1, 2003; 2003 American Chemical Society; published on Web Dec. 2, 2003.

* cited by examiner

DYE SENSITIZED SOLAR CELL

Applicants claim foreign priority benefits under Title 35 U.S.C. §119 of European Patent Application No. 03405306.6 filed Apr. 30, 2003.

The present invention concerns a dye-sensitized solar cell or DSSC. DSSCs are regenerative photo-electrochemical cells comprising a photoanode, said photoanode comprising at least one semiconductive metal oxide layer on a conductive substrate, sensitized by at least one chromophoric substance, a counter-electrode, and an electrolyte positioned between these electrodes.

In cells of this type, at least one of these electrodes is sufficiently transparent or translucent for allowing light input. The afore-said semi-conductive metal oxide layer is conveniently polycrystalline. For this purpose, particularly suitable are oxides of transition metals and elements either of the third main group, or of the fourth, fifth and sixth sub-groups of periodic table of elements, the surface of the photoanode in contact with the electrolyte being porous, with a porosity factor of preferably at least 20. The "porosity factor" is defined as the ratio of the photo-electrochemically active surface of the photoanode to the surface area of the substrate covered by the layer(s) of semiconductive metal oxide.

The use of nanocrystalline titanium dioxide was shown to be particularly advantageous. The term "nanocrystalline" means that the semiconductive metal oxide, in particular $TiO_2$, is in polycrystalline form with a granulometry of the order of several nanometers, for example 10 to 50 nanometers.

In this type of cell, a chromophoric substance, often called photosensitizer or photosensitizing dye, preferably forms a substantially monomolecular layer attached to the semiconductive metal oxide layer, in particular the nanocrystalline $TiO_2$ layer. The chromophoric substance may be bound to the metal oxide layer by means of anchoring groups like carboxylate or phosphonate or cyano groups or chelating groups with Π-conducting character like oxymes, dioxymes, hydroxyquinolines, salicylates and α-keto-enolates. Several transition metal complexes, in particular ruthenium complexes, but also osmium or iron complexes, with heterocyclic ligands like bidentate, tridentate or polydentate polypyridil compounds, have been shown to be efficient photosensitizing dyes. Cells of this type are already known and are described inter alia in EP 0333641 and EP 0525070.

Among suitable electrolytes are those including a redox system consisting of a mixture of at least one electrochemically active salt and at least one molecule designed to form an oxidation-reduction system with either the anion or cation of the said salt. Electrolytes wherein said electrochemically active salt has a melting point below ambient temperature or forms with the afore-said molecule a phase with a melting point below ambient temperature have been described in EP 0737358.

Dye-sensitized solar cells provide an economically credible alternative to conventional inorganic photovoltaic devices. Owing to their high-energy conversion efficiency and low production cost, they have received considerable attention over the past decade. The mesoscopic texture of the $TiO_2$ film in these cells significantly increases the cross section of light harvesting by surface-anchored charge transfer sensitizers while maintaining a good contact with electrolytes. In these photovoltaic devices, ultrafast electron-injection from a photoexcited dye into the conduction band of an oxide semiconductor, and subsequently dye regeneration and hole transportation to the counter electrode, are responsible for the efficient generation of electricity.

A respectable 10.4% light-to-electricity conversion efficiency at AM 1.5 solar irradiance has been obtained for photovoltaic devices with a panchromatic dye and a liquid electrolyte containing the triiodide/iodide couple, as reported in J. Am. Chem. Soc. 123, 1613-1624 (2001).

Bonhôte et al. (J. Am. Chem. Soc. 1999, 121, 1324-1336) studied the photoinduced charge separation in assemblies comprising a photosensitizing dye and an electron donating triarylamine, grafted onto the dye or co-adsorbed with the dye on $TiO_2$ films.

Document WO 03/065394 proposes the co-adsorption of co-sensitizers belonging to a class of materials that include aromatic amines, in particular triarylamines, and carbazoles, that have the ability to donate electrons to the sensitizing dye, on the surface of the semiconductor oxide layer, in order to improve the charge transfer efficiency and reduce the back transfer of electrons from the semiconductor oxide to the sensitizing dye.

However the achievement of long-term stability at temperatures of 80-85° C., which is an important requirement for outdoor application of the DSSC, still remains a major challenge.

The leakage of liquid electrolyte from such DSSC modules, possible desorption of loosely attached dyes and photodegradation in the desorbed state, as well as corrosion of the photoelectrode and/or counter electrode by the triiodide/iodide couple, may be considered as some critical factors limiting the long-term performance of the DSSC, especially at elevated temperature. A particular problem of stability at 80° C. in DSSCs containing the iodide/triiodide redox couple, upon aging, is the drop in open circuit potential (Voc), causing the poor stability. It is believed that the dark current of DSSCs increases and Voc decreases, due to the interaction of triiodide with bare zones of the $TiO_2$ electrode, that is not completely covered with dye molecules. Efforts to realize devices with high efficiencies that meet the stability criteria for outdoor use may deal with new counter electrode materials, alternative redox couples and new sensitizers. Additionally, gelified materials incorporating triiodide/iodide as a redox couple, as disclosed by EP 1087412, were introduced to substitute the liquid electrolytes by quasi-solid state materials. Polymer gel electrolytes comprising a non-conducting polymer and an organic molten salt have been proposed by U.S. Pat. No. 6,245,847, with special emphasis on applications to lithium batteries, super capacitors or electrochromic windows for mitigating the potential instability against leakage under thermal stress.

However, until now, no satisfactory long-term thermal stability results at temperatures up to and above 80° C. are reported for high power DSSCs, together with acceptable efficiencies, and it is still necessary to propose measures, which alone or in combination, are capable to improve such thermostability of DSSCs.

According to a first aspect of the DSSC according to the present invention, an amphiphilic compacting compound is co-adsorbed with the dye on the surface of the semiconductive metal oxide layer forming a mixed monolayer. The molecular structure of said compacting compound comprises at least one anchoring group, a hydrophobic portion and a terminal group.

The anchoring group of the compacting compound, binding to the surface of the semiconductive metal oxide layer, may be selected from the group consisting of COOH, $PO_3H_2$, $PO_4H_2$, $SO_3H_2$, $SO_4H_2$, CONHOH or deprotonated forms thereof.

The anchoring group of the compacting compound may also be a chelating group with Π-conducting character, in particular an oxyme, dioxyme, hydroxyquinoline, salicylate or α-keto-enolate group.

Since optical density measurements of the mixed monolayer show a decrease in the optical density, if compared to the optical density of an adsorbed monolayer made of a neat dye, it appears that the compacting agent does go onto the surface along with dye molecules, rendering such a monolayer compact. It is thus believed that said sensitizing dye and said compacting compound form a self-assembled compact mixed monolayer on said semiconductive metal oxide layer.

It is further believed that the hydrophobic portion of the compacting compound forms together with corresponding portions of the dye molecules a dense hydrophobic level within the monolayer, hindering the access of polar species present in the electrolyte to the surface of the semiconductive metal oxide layer.

The terminal group of the compacting compound may be an uncharged group. The terminal group may consist of the free end of an alkyl, alkenyl, alkynyl, alkoxyl or poly-ether chain. The terminal group may consist of a neutral group taking up more space, like a branched alkyl, or a carbon atom substituted by several cycloalkyl or phenyl groups.

Without being bound by theory, it is believed that when the compacting molecules co-adsorbed with the sensitizing dye have a sufficient chain length and if the ends of these chains bear a terminal group (Y) constituted by a bulky neutral hydrophobic group like branched alkyls, these terminal groups have a capping function protecting the dye layer and the anode surface from electrolyte components, among them triiodide, and also from water, the presence of traces of the latter in a DSSC being hardly avoidable.

The terminal group of the compacting compound may be an anionic group. Such terminal group may be selected among the same group as the anchoring groups, that is to say $SO_3^-$, $CO_2^-$, $PO^{2-}_3$, $PO_3H^-$, $CONHO^-$.

The terminal group of the compacting compound may be a cationic group. Such terminal group may be selected among ammonium, phosphonium, sulfonium, imidazolium, pyrrolidonium and pyridinium groups.

In turn, when the molecules co-adsorbed with the sensitizing dye have a sufficient chain length and if the ends of these chains bear a charged group (Y), these groups surmount the hydrophobic level of the mono-layer and are capable of repelling species present in the electrolyte, thereby preventing once again direct interaction of the species of the electrolyte with parts of the semiconductive metal oxide surface itself.

In view of an outdoor use, exposed to sun at elevated temperatures, the compacting compound is preferably selected so that said self-assembled monolayer is a dense packed monolayer having an order-disorder transition temperature above 80° C.

Preferred compacting compounds are selected among compounds of following formulae (1) to (27)

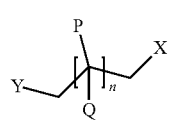

(1)

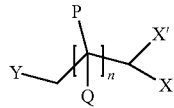

(2)

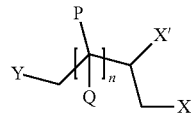

(3)

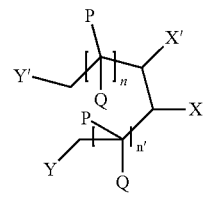

(4)

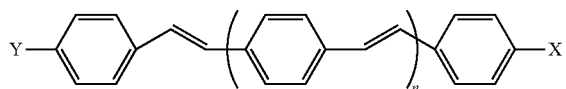

(5)

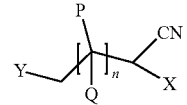

(6)

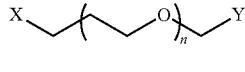

(7)

(8)

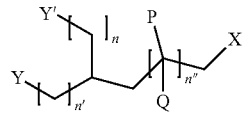

(9)

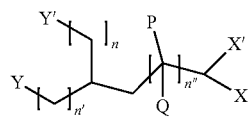

(10)

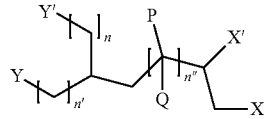

(11)

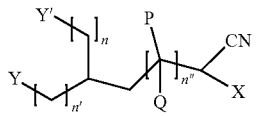

(12)

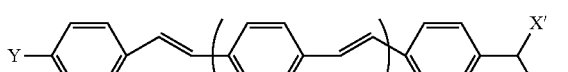

(13)

(14)

(15) 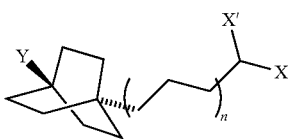

(16) 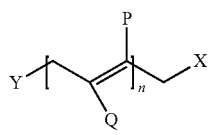

(17) 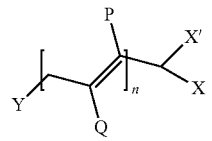

(18) 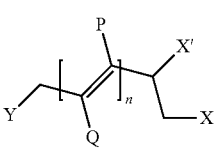

(19) 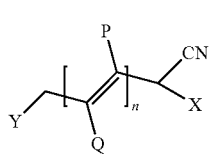

(20) 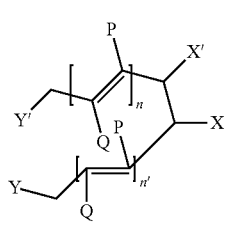

(21) 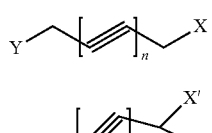

(22) 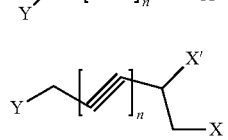

(23) 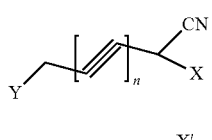

(24) 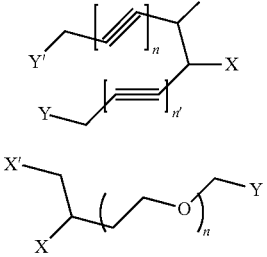

(25)

(26)

(27) 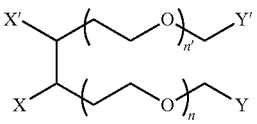

With the proviso
that P=Q=H (hydrogen)
or P=H and Q=F (fluoride)
or P=Q=F
that X and X' are, independently one from the other, one of the groups $SO_3^-$, $CO_2^-$, $PO_3^{2-}$, $PO_3H^-$ and $CONHO^-$
that n, n' and n'' designate the same or different integers from 1 to 20
that Y and Y' are, independently one from the other, one of the groups $SO_3^-$, $CO_2^-$, $PO_3^{2-}$, $PO_3H^-$ and $CONHO^-$ or a group having one of formulae (101) to (105)

(101) 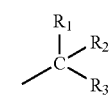

(102) 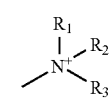

(103) 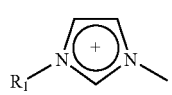

(104) 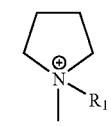

(105) 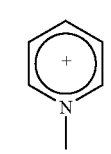

Wherein $R_1$, $R_2$, $R_3$ designate independently one from the other H, a phenyl group or an alkyl group of 1 to 20 carbon atoms.

The compacting compound may be selected from the group consisting of alkyl carboxylic acids, alkyl dicarboxylic acids, alkyl carboxylates, alkyl phosphonic acids, alkyl phosphonates, alkyl diphosphonic acids, alkyl diphosphonates, alkyl sulphonic acids, alkyl sulphonates, alkyl hydroxamic acids, alkyl hydroxamates, wherein alkyl is linear or branched from $C_1$ to $C_{20}$.

The compacting compound may be selected from cyclohexane-carboxylic acid, adamantane acetic acid, adamantane propionic acid and 4-pentylbicyclo(2,2,2)-octane-1-carboxylic acid.

None of the above-cited compacting compounds are electron donating species.

The molar ratio of said sensitizing dye to said co-adsorbed compacting compound may be of between 10 and ½, and preferably of between 5 and 1. Depending upon the selection of the dye and the co-adsorbent, i.e. their relative affinity constant for the TiO2 layer, the ratio of dye and co-adsorbent can be varied from 1:10 to 10:1 in their common solvent if they are adsorbed simultaneously, i.e. within the same preparative step. Alternatively, the compacting compound may be adsorbed in a preliminary adsorption step, before the adsorption of the dye, as a pre-treatment, or after the adsorption of the dye, as a post-treatment separate adsorption step.

Without being bound by theory, it is believed that the sensitizing dye molecules and the compacting compound molecules co-adsorbed in the afore-said ratios constitute a closely packed monolayer forming a barrier, in particular versus triiodide. It is believed that the triiodide can no more reach the TiO$_2$ surface and that therefore the dark current decreases by decreasing the back electron transfer from the photo injected electrons of TiO$_2$ to triiodide. It is also believed that the hydrophobic portion of the mixed monolayer constitutes a barrier against H2O, hindering water residues to reach the surface of the photoanode. It is further believed that the presence of the co-adsorbing compacting compound contributes in structuring the arrangement of the adsorbed dye molecules.

According to a second aspect of the DSSC, object of the present invention, the sensitizing dye may be selected among dyes having an amphiphilic structure. Among these, ruthenium complexes having amphiphilic structures may be obtained by substituting hydrophobic substituents, in particular aliphatic chains of tuned length, on the heterocyclic ligands of Ru. Among suitable dyes are compounds of formula RuLL'X$_2$, wherein L is 4,4'-di-carboxylic acid,-2,2'-bipyridine and L' is 4,4'-di-alkyl-2,2'-bipyridine, wherein the alkyl substituent has a mid-sized chain length, in particular C$_6$-C$_{20}$, and X is a halogen, H$_2$O, CN and amine, NCS or NCO.

A particularly preferred sensitizing dye is called Z-907, which is a Ru(II) complex of formula RuLL'(NCS)$_2$, in which L represents the ligand 4,4'-dicarboxylate-2,2'-bipyridine and L' represents the ligand 4,4'-dinonyl-2,2'-bipyridine.

Without being bound by theory, it is believed that the hydrophobic part of the amphiphilic sensitizing dye, in particular a substituent alkyl chain of mid-sized length of between C$_6$-C$_{20}$, co-operating with the hydrophobic part of the afore-said co-adsorbing compacting compound, like an alkyl chain of appropriate length, forms a compact arrangement, namely a substantially dense hydrophobic layer shielding the surface of the semiconductive metal oxide layer.

According to another aspect of the DSSC, object of the present invention, the electrolyte of the DSSC may comprise a polar organic solvent having a high boiling point. Boiling points over 100° C. at standard atmospheric pressure are preferred. A suitable compound to be used as organic solvent in the framework of the present invention may be found among nitrites. A preferred nitrile is 3-methoxypropionitrile (MPN).

The solvent may be useful on one hand for solubilizing an electrochemically active salt present in the electrolyte, and/or the compound forming the redox couple with an ion of said salt. On the other hand, a solvent with a relatively low boiling point may be useful to dissolve a matrix polymer during the manufacturing process of the cell, a part of said solvent being removed, for example by suction under vacuum, upon completion of said process. The solvent which may amount to 1-20% by weight of the electrolyte may also act as a plasticizer on the matrix polymer.

According to a further aspect of the DSSC, object of the present invention, the electrolyte of the DSSC may comprise a gelifying compound, in particular a polymer forming a polymer matrix. A polymer matrix provides a beneficial physical state to the electrolyte, namely a solid state, a quasi-solid state, a rubber-like state or a gel state, depending on the composition which is maintained at the operating temperature of the cell under adverse conditions, namely at least up to 80° C. A suitable polymer may be selected from polyvinyldenefluoride (PVDF), polyvinylidenefluoride-hexafluoropropylene (PVDF-HFP), polyvinylidenefluoride-hexafluoropropylene-chlorotrifluoroethylene (PVDF-HFP-CTFE) copolymers, polyethylene oxide, polymethylmethacrylate, polyacrylonitrile, polypropylene, polystyrene, polybutadiene, polyethyleneglycol, polyvinylpyrrolidone, polyaniline, polypyrrole, polythiophene and their derivatives. Preferred polymers are polyvinylidenefluoride-hexafluoropropylene copolymers (PVDF-HFP).

The electrolyte of the DSSC object of the present invention may also comprise, as a gelifying compound, a metal oxide in form of nanoparticles capable to form a gel matrix. Such a gel matrix provides a beneficial physical state to the electrolyte, namely a solid state, a quasi-solid state or a gel state, that is maintained at the operating temperature of the cell under adverse conditions, namely at least up to 80° C. A suitable nanoparticle metal oxide may be selected from SiO$_2$ or TiO$_2$ or Al$_2$O$_3$, or MgO or TiO$_2$ nano-tubes or TiO$_2$ nano-rods, wherein the gel contains said nanoparticles in minor proportions, preferably 2-20 Wt % of the electrolyte. Preferred gelifying compounds are SiO$_2$ or TiO$_2$ nanoparticles.

In still another aspect of the DSSC according to the present invention, the electrolyte may comprise, instead of an electrochemically active salt which is solid at ambient temperature and shall be dissolved in a solvent, a so-called "room temperature molten salt", an electrochemically active salt having a melting point lower than ambient temperature, or a salt selected so that the mixture formed by this salt and another species of the redox system has a melting point lower than ambient temperature. Then, presence of a solvent may be avoided. The cation of the electrochemically active salt may comprise at least one quaternary nitrogen. The quaternary nitrogen may be comprised in a group selected from imidazolium and triazolium type groups, corresponding to the following general formulae (a) or (b):

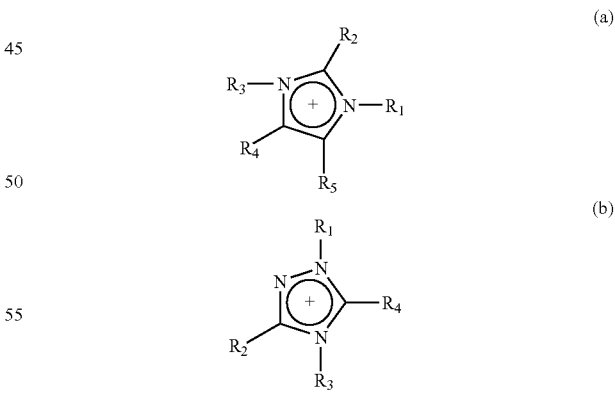

where the groups $R_1$, $R_2$, $R_3$, $R_4$ and $R_5$ are identical or different and are selected from hydrogen and linear or branched alkyl groups, with 1 to 20 carbon atoms, linear or branched alkoxy groups with 1 to 20 atoms of carbon, fluoride substitution derivatives of alkyl groups, alkenyl groups, and combinations of these groups and the corresponding halogenides, or from the alkoxyalkyl and polyether groups.

The cation of the electrochemically active salt may also be an ammonium, a phosphonium or a sulfonium group corresponding to the following general formulae (c), (d) or (e):

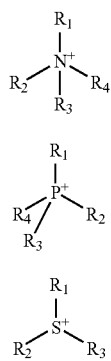

In which groups $R_1$, $R_2$, $R_3$, $R_4$ have the same meanings as above.

The anion of said ionic liquid salt may be selected from halide ions, or a polyhalide ion, or a complex anion containing at least one halide ion, $CF_3SO_3^-$, or $CF_3COO^-$ or $(CF_3SO_2)_3C^-$ or $NO_3^-$ or $PF_6^-$ or $BF_4^-$ or $N(CN)_2^-$ or $NCS^-$ $SeCN^-$ or $ClO4^-$ or $C(CN)3^-$ or $RSO_3^-$ or $RSO_4^-$, where R is selected from hydrogen and linear or branched alkyl groups, with 1 to 20 carbon atoms, linear, or branched alkoxy groups with 1 to 20 atoms of carbon.

The redox system of the electrolyte may comprise two salts or more, each having a melting point below ambient temperature, the anions forming a couple of two different electrolytes, for example the iodide/bromide couple.

In a still further aspect of the DSSC, object of the present invention, the electrolyte incorporates a first compound co-operating with either the anion or the cation of the electrochemically active salt, that is to say forming a redox couple with said ion. As a well-known example of such a couple, if the anion of the electrochemically salt is $I^-$, the neutral molecule, respectively element, is iodine.

In still a further aspect of the DSSC, object of the present invention, the electrolyte may incorporate a stabilizing additive in form of a neutral molecule comprising one or more nitrogen atom(s) with a lone electron pair.

Said neutral molecule may be selected from molecules having following formula:

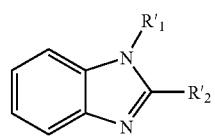

wherein $R'_1$ and $R'_2$ can be H, alkyl, alkoxyl, alkenyl, alkynyl, alkoxy-alkyl, poly-ether, and/or phenyl, independently one from the other, the number of carbon atoms of each substituent ranging from 1 to 20, the substitute being linear or branched.

Preferred compounds are Benzimidazole, 1-methylbenzimidazole, 1-methyl-2-phenyl benzimidazole and 1,2 dimethyl benzimidazole.

The presence of the afore-said neutral additive compound in the electrolyte increases the stability of the DSSC.

Other particulars and advantages of the DSSC according to the invention, in particular improved performance and stability at high temperature, will appear to those skilled in the art from the description of the following examples in connection with the drawings, wherein:

FIG. 1 is a photocurrent density—voltage curve;

FIG. 2 presents device parameters versus time;

EXAMPLE 1

Fabrication of Self-Assembled Monolayers

The dye Z-907 is synthesized according to the method described in Langmuir 2002, 18, 952-954 or Nature materials 2003, 2, 402-407.

A screen-printed double layer of $TiO_2$ particles was used as photoanode. A 10 μm thick film of 20 nm sized $TiO_2$ particles was first printed on the fluorine-doped $SnO_2$ conducting glass electrode and further coated by 4 μm thick second layer of 400 nm light scattering anatase particles (CCIC, Japan). After sintering at 500° C. and cooling down to 80° C., the $TiO_2$ electrodes were dye-coated by immersing them into a 0.3 mmol$-1^{-1}$ solution of Z-907 in acetonitrile and tert-butanol (volume ratio: 1:1) at room temperature for 12 hours and then assembled with thermally platinized conducting glass electrodes.

Self-assembled monolayers combining dye and co-adsorbent compound 1-decylphosphonic acid (DPA) were obtained by dissolving in the same solvent as above Z-907 and the co-adsorbent compound in a molar ratio 4:1. After overnight soaking, the electrode was washed with acetonitrile to remove loosely bound dye and/or co-adsorbent molecules. The following construction steps of the solar cells photoelectrodes having neat Z-907 adsorbed on the $TiO_2$ layer and combined Z-907+co-adsorbent on the $TiO_2$ layer are the same.

EXAMPLE 2

Fabrication of Solar Cells with Polymer Gel Electrolyte

The electrodes were separated by a 35 μm thick hot-melt ring (Bynel, DuPont) and sealed up by heating. PVDF-HFP (5 wt %) was mixed with the liquid electrolyte consisting of DMPII (1,2 dimethyl-3-propylimidazolium iodide 0.6 mol $1^{-1}$), iodine (0.1 mol $1^{-1}$), NMBI (N-methylbenzimidazole 0.5 mol $1^{-1}$) in MPN (3-methoxypropionitrile) and heated until no solid was observed. The internal space of the cell was filled with the resulting hot solution using a vacuum pump. After cooling down to room temperature, a uniform motionless polymer gel layer was formed in cells. The electrolyte-injecting hole made with a sand-ejecting drill on the counter electrode glass substrate was sealed with a Bynel sheet and a thin glass cover by heating. In order to have a good comparison with the polymer gel electrolyte, devices with the liquid electrolyte were also fabricated using the above procedure.

Figure 1:
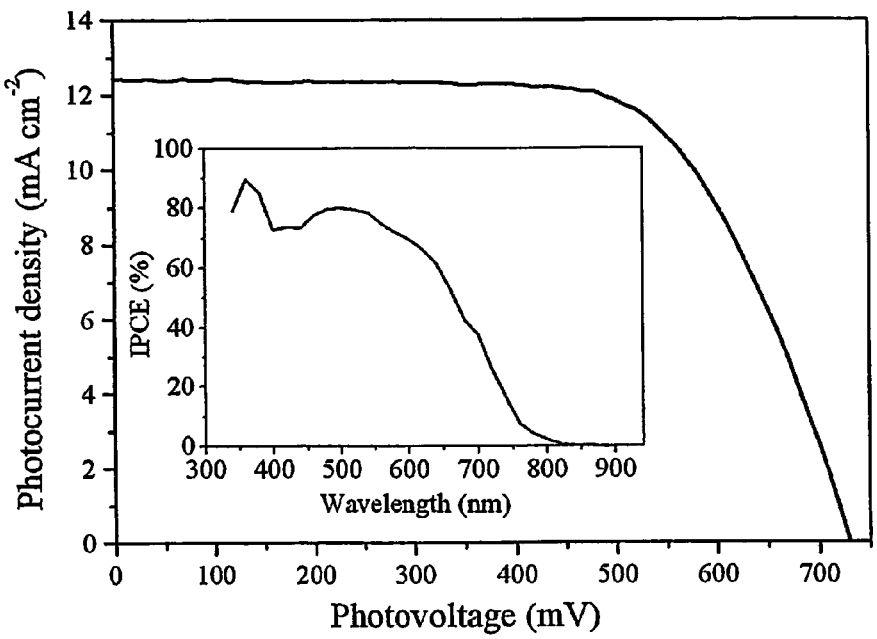

FIG. 1 presents a typical photocurrent density-voltage curve for cells based on the Z-907 dye and the polymer gel electrolyte under AM 1.5 sunlight illumination. The short-circuit photocurrent density (Jsc), open-circuit voltage (Voc), and fill factor (FF) are 12.5 mA cm$^2$, 730 mV and 0.67, respectively, yielding an overall energy conversion efficiency ($\eta$) of 6.1%. The action spectrum of the photocurrent is shown in the inset of FIG. 1. The incident photon-to-current conversion efficiency (IPCE) reaches a maximum efficiency of 80% at 540 nm. The photovoltaic performance obtained with liquid and polymer gel electrolytes is almost identical (Table 1) indicating that gelation has no adverse effect on the conversion efficiency.

TABLE 1

Device efficiencies of cells with the liquid and polymer gel electrolytes.

| | $\eta$ (%) at different incident light intensities* | | | |
|---|---|---|---|---|
| Electrolytes | 0.01 Sun | 0.1 Sun | 0.5 Sun | 1.0 Sun |
| Liquid | 7.5 | 7.4 | 6.9 | 6.2 |
| Gel | 7.6 | 7.3 | 6.8 | 6.1 |

*The spectral distribution of the lamp mimics air mass 1.5 solar light. 1.0 Sun corresponds to an intensity of 100 mW cm$^{-2}$.

EXAMPLE 3

Aging Tests of Cells Sensitized without Compacting Co-Adsorbent

Figure 2:
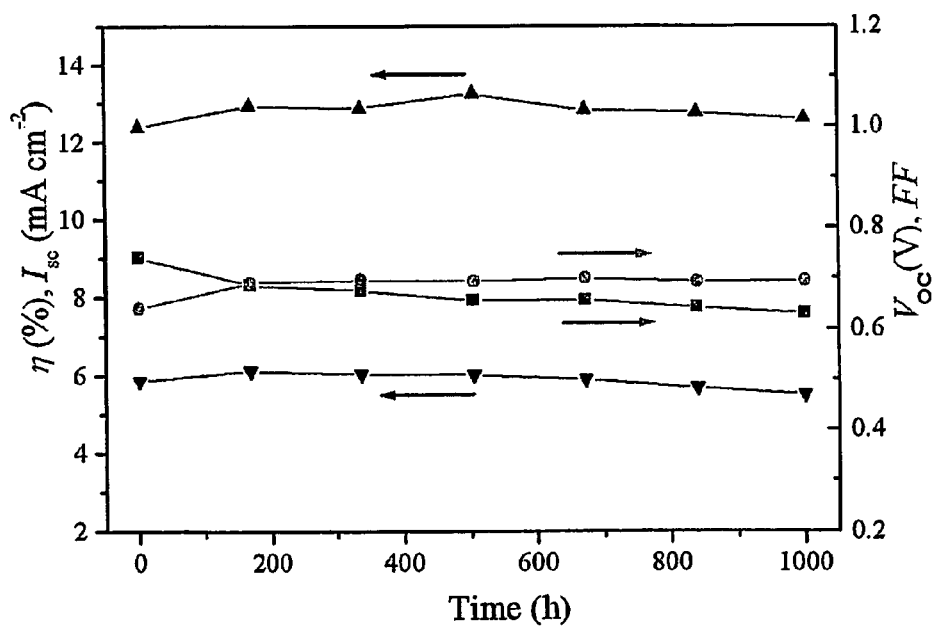

FIG. 2 presents the detailed behavior of device parameters during the aging tests performed at 80° C. with the DSSC containing polymer gel electrolyte. After the first week of aging the efficiency was moderately enhanced due to an increase in the Jsc and FF values. Then a gradually small decrease in the Voc without much variation in Jsc and FF caused a decrease in the overall efficiency by 6%. This is well within the limit of thermal degradation accepted for silicon solar cells.

Figure 3:
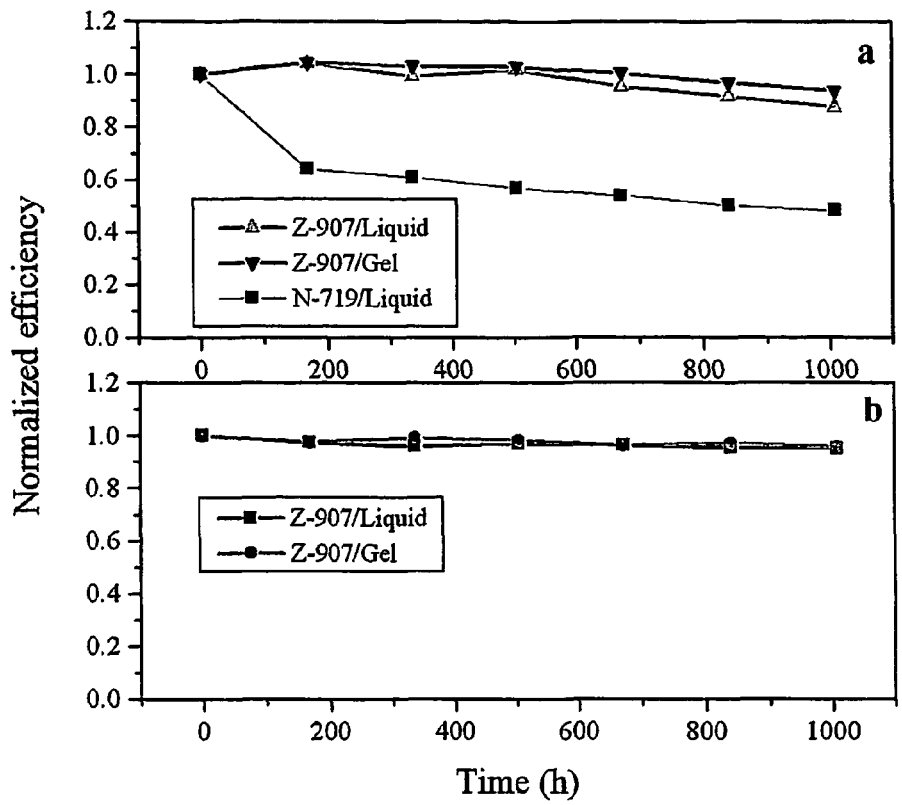
FIG. 3 shows the evolution of conversion efficiencies versus time.

The device also showed an excellent photostability when submitted to accelerated testing in a solar simulator at 100 mW cm$^{-2}$ intensity. Thus after 1,000 h of light soaking at 55° C. the efficiency had dropped by less than 5% (FIG. 3, graph b) for cells covered with a UV absorbing polymer film. The efficiency difference for devices tested with and without the polymer film was only 4% at AM 1.5 sunlight indicating a very small sacrifice in efficiency due to UV filter.

The high conversion efficiency of the cell was sustained even under heating for 1,000 h at 80° C., maintaining 94% of its initial value after this time period as shown in FIG. 2. The device using the liquid electrolyte retained only 88% of its initial performance under the same condition. The difference may arise from a decrease in solvent permeation across the sealant in the case of the polymer gel electrolyte. The polymer gel electrolyte is quasi-solid at room temperature but becomes a viscous liquid (viscosity: 4.34 mPa·s) at 80° C. compared with the blank liquid electrolyte (viscosity: 0.91 mPa·s). Tolerance of such a severe thermal stress by a DSSC having over 6% efficiency is unprecedented. Whereas in the case of the N-719 dye RuL$_2$(NCS)$_2$ the overall efficiency decreased almost 35% during the first week at 80° C., FIG. 3, graph a clearly reflects the effect of molecular structure of the sensitizer on the stability of the DSSC. The difference between N-719 and Z-907 is that one of the L ligands 4,4'-dicarboxylic acid-2,2'-bipyridine is replaced with 4,4'-dinonyl-2,2'-bipyridine to make the dye more hydrophobic. We believe that desorption of N-719 at high temperature resulted in the poor thermostability of related devices. So far, dye sensitized solar cells have been plagued by performance degradation at temperatures between 80 and 85° C. The best result obtained in previous studies was a decline in conversion efficiency from initially 4.5 to 3% when the cell was maintained over 875 h at 85° C. The use of the amphiphilic Z-907 dye in conjunction with the polymer gel electrolyte was found to result in remarkably stable device performance both under thermal stress and light soaking.

EXAMPLE 4

Fabrication of Self-Assembled Monolayers and Solar Cells Comprising HDMA as a Compacting Co-Adsorbent Self-assembled monolayers combining dye and co-adsorbent compound hexadecylmalonic acid (HDMA) were obtained by dissolving in the same solvent as above Z-907 and the co-adsorbent compound in a molar ratio 1:1. After overnight soaking, the electrode was washed with acetonitrile to remove loosely bound dye and/or co-adsorbent molecules. The following construction steps of the solar cells photoelectrodes having neat Z-907 adsorbed on the TiO$_2$ layer and combined Z-907+co-adsorbent on the TiO$_2$ layer are the same.

Figure 4:
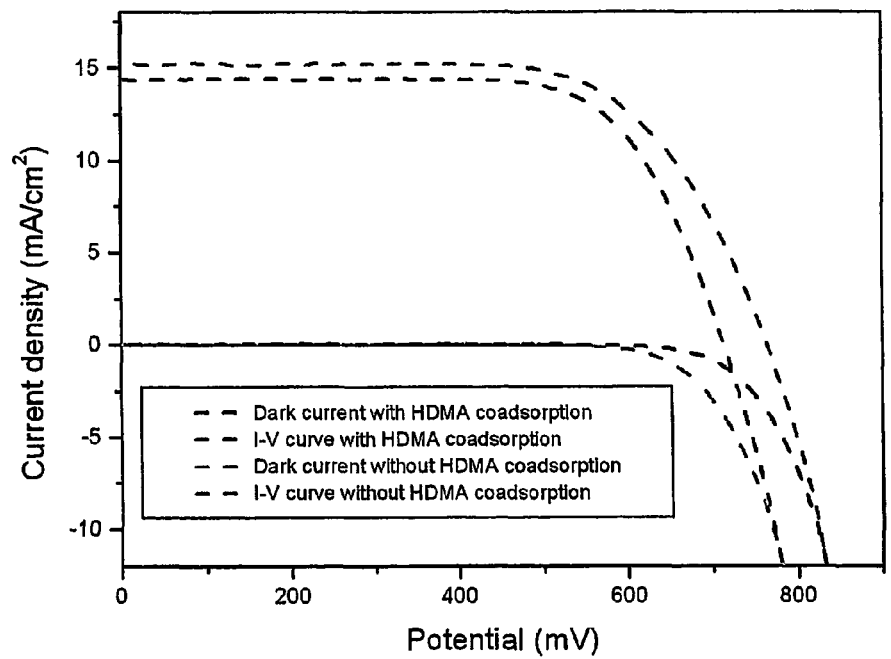
FIG. 4 shows comparative current density/potential curves in presence and absence of a compacting co-adsorbent, 16-hexaadecylmalonic acid.

The electrodes were separated by a 35 μm thick hot melt ring (Bynel, DuPont) and sealed up by heating. The liquid electrolyte consisting of MPII (1 methyl-3-propylimidazolium iodide 0.6 mol l$^{-1}$), iodine (0.1 mol l$^{-1}$), NMBI (N-methylbenzimidazole 0.5 mol l$^{-1}$) in MPN (3-methoxypropionitrile) injected into the cell. As shown in FIG. 4 the overall cell efficiency with the same electrolyte increases in presence of HDMA co-adsorbent from 7.2 to 7.9 due to the increase in the open circuit potential (Voc) and current density. The device efficiencies at different light intensities is reported in Table 2. It clearly shows the enhancement of efficiencies due to the co-adsorbtion of HDMA with Z-907 dye.

TABLE 2

Device efficiencies of cells with the liquid electrolytes.

| | $\eta$ (%) at different incident light intensities* | | | |
|---|---|---|---|---|
| Dye | 0.01 Sun | 0.1 Sun | 0.5 Sun | 1.0 Sun |
| Z-907 | 7.2 | 7.6 | 7.7 | 7.2 |
| Z-907 + HDMA | 8.6 | 8.7 | 8.4 | 7.9 |

*The spectral distribution of the lamp mimics air mass 1.5 solar light. 1.0 Sun corresponds to an intensity of 100 mW cm$^{-2}$.

EXAMPLE 5

Aging Tests of DSSC's Containing Z907+DPA Mixed Monolayers, with Different Electrolytes Self-assembled monolayers combining dye and co-adsorbent compound 1-decylphosphonic acid (DPA) were obtained as described in example 1.

Figure 5:
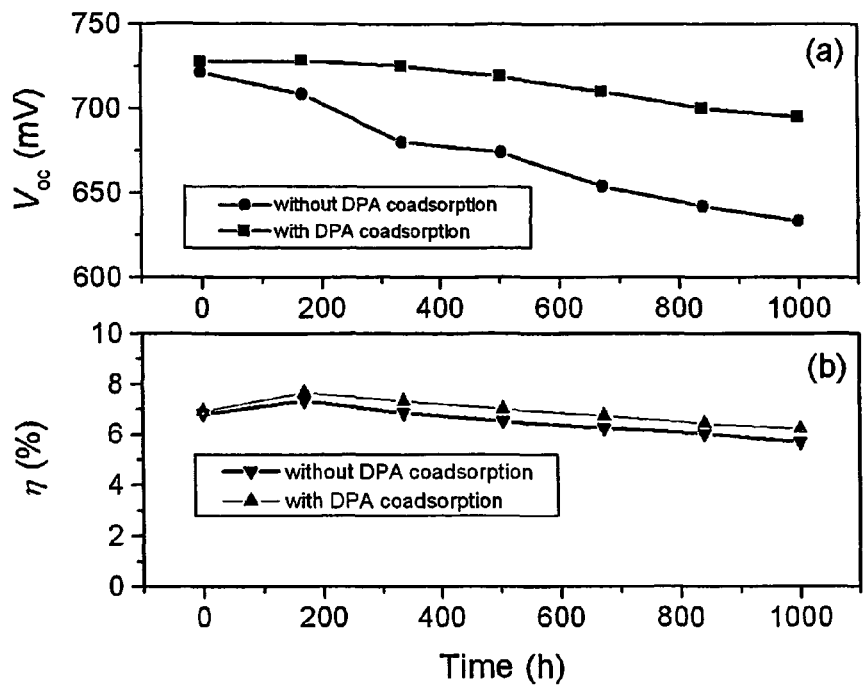
FIG. 5 shows comparative current density/potential curves in presence and absence of a compacting co-adsorbent, 10-decylphosphonic acid.

Five different electrolytes were prepared:
Electrolyte 1
1-methyl-3-propylimidazoliumiodide=0.6 mol·l$^{-1}$
N-methylbenzimidazole=0.5 mol·l$^{-1}$
Iodine=0.1 mol·l$^{-1}$
In 3-Methoxypropionitrile as a solvent.
Electrolyte 2
1-methyl-3-propylimidazoliumiodide=0.6 mol·l$^{-1}$
N-methylbenzimidazole=0.5 mol·l$^{-1}$
Iodine=0.1 mol·l$^{-1}$
Guanidinium thiocyanate=0.1 mol·l$^{-1}$
In 3-Methoxypropionitrile as a solvent.
Electrolyte 3
1,2-methyl-3-propylimidazoliumiodide=0.6 mol·l$^{-1}$
N-methylbenzimidazole=0.5 mol·l$^{-1}$
Iodine=0.1 mol·l$^{-1}$
SiO$_2$=5 wt %
In 3-Methoxypropionitrile as a solvent.
Electrolyte 4
1,2-dimethyl-3-propylimidazolium iodide=0.6 mol·l$^{-1}$
Iodine=0.1 mol·l$^{-1}$
N-butylbenzimidazole=0.5 mol·l$^{-1}$
In 3-methoxypropionitrile as a solvent The cell was submitted to an accelerated aging test at 80° C. containing electrolyte 1. As shown in FIG. 5, the drop of Voc in the device with co-adsorbent DPA is significantly slower during the 1000 h aging test at 80° C. than the drop of Voc in the device without a coadsorbent in the dye layer: as shown by FIG. 5, graph a, the drop of Voc in the presence of co-adsorbent DPA is of about 25 mV, whereas it is of about 90 mV in the absence of a coadsorbent. As shown by FIG. 5, graph b, the overall efficiency under 1 sun visible light soaking remains higher during the whole test in presence of co-adsorbed DPA.

Figure 6:
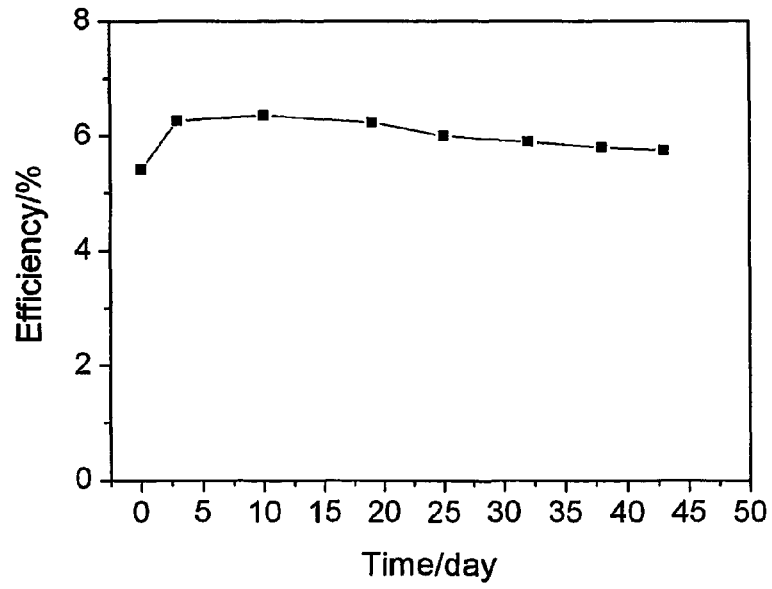
FIG. 6-8 show efficiency versus time curves of devices provided with the same dye+compacting co-adsorbent(10-decylphosphonic acid) layer with three different electrolytes.

FIG. 6 presents the variation in the efficiency of the device measured at AM1.5 sunlight during the aging tests performed at 80° C. with the DSC containing electrolyte 2.

Initially there is an increase in the efficiency due to an increase in the Jsc and FF values. Then a gradually small decrease in the Voc without much variation in Jsc and FF caused a decrease in the overall efficiency by less than 10%.

Figure 7:
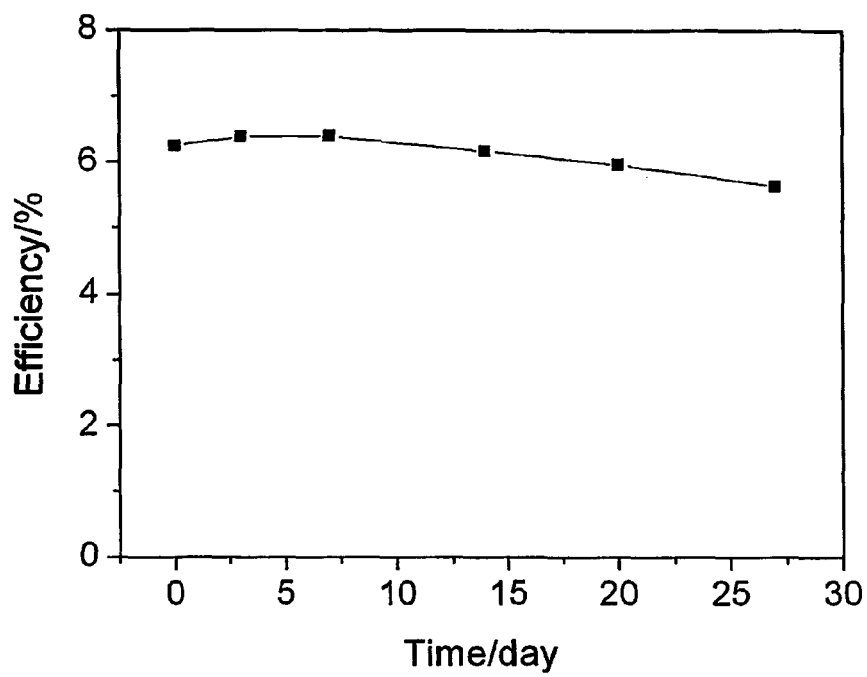

FIG. 7 presents the variation in the efficiency of device measured at AM1.5 sunlight during the aging tests performed at 80° C. with the DSC containing electrolyte 3 as a quasi-solid electrolyte.

Figure 8:
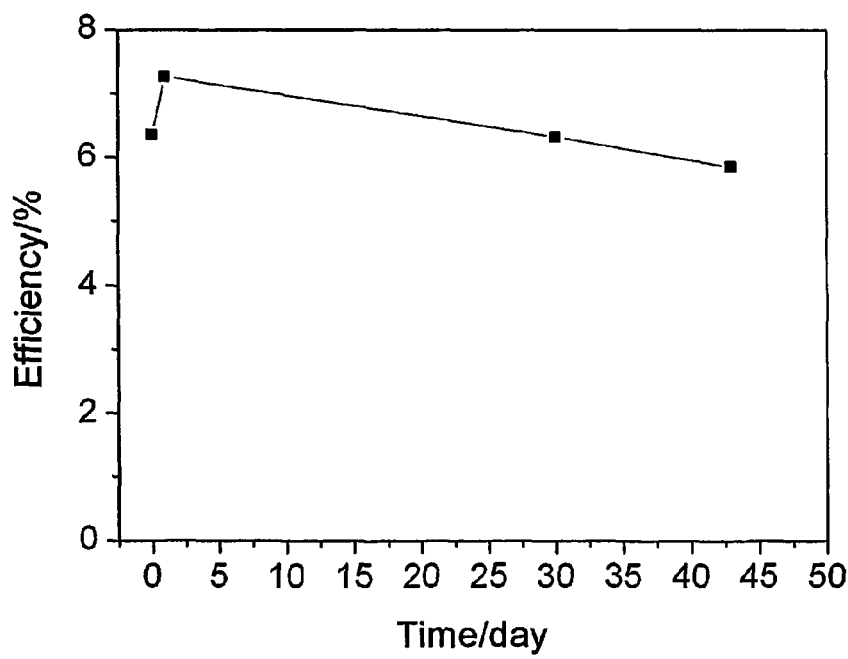

FIG. 8 presents the variation in the efficiency of device measured at AM1.5 sunlight during the aging tests performed at 80° C. with the DSC containing electrolyte 4. It demonstrated an excellent thermal stability over 1000 h time period.

EXAMPLE 6

Aging Test of a DSSC Containing a Z907+PPA Mixed Monolayer

Self-assembled monolayers combining dye and co-adsorbent compound 3-phenylpropionic acid (PPA) were obtained by dissolving in the same solvent as above Z-907 and the co-adsorbent compound in a molar ratio 1:1. After overnight soaking, the electrode was washed with acetonitrile to remove loosely bound dye and/or co-adsorbent molecules. The following construction steps of the cell are the same as described above. The composition of the electrolyte is:
Electrolyte 5
N-methylbenzimidazole=0.5 mol·l$^{-1}$
Iodine=0.2 mol·l$^{-1}$
In 1-methyl-3-propylimidazoliumiodide and 1-methyl-3-ethylimidazoliumthiocyanate ionic liquids (65:35 volume ratio).

Figure 9:
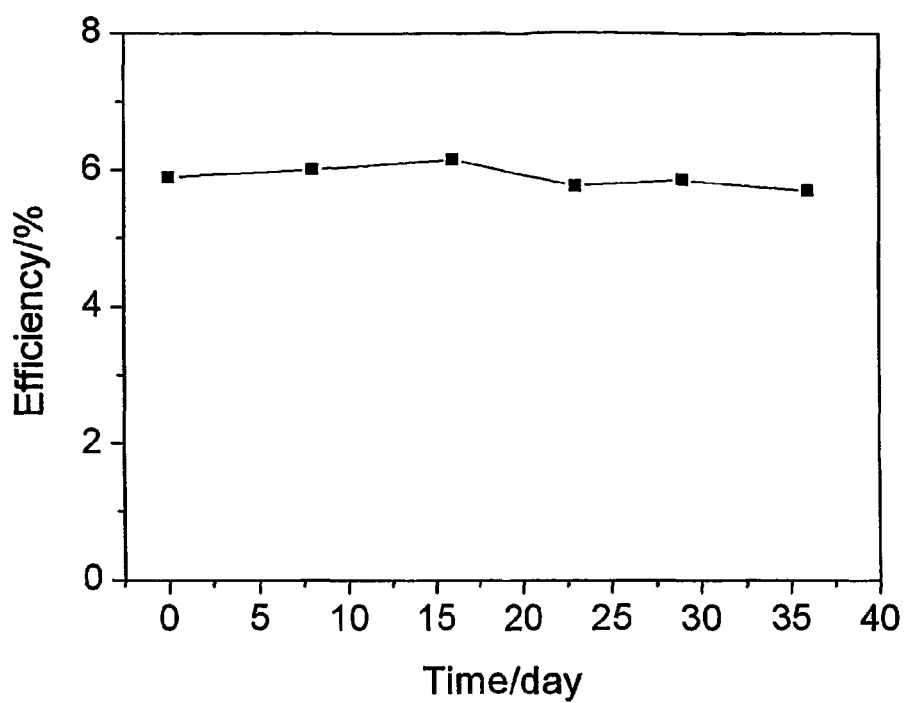
FIG. 9 shows an efficiency versus time curve of a device provided with the same dye+compacting co-adsorbent 3-phenylpropionic acid layer and with an ionic liquid electrolyte.

FIG. 9 presents the device excellent photostability when submitted to accelerated testing in a solar simulator at 100 mW cm-2 intensity containing electrolyte 5. Thus after 1,000 h of light soaking at 55° C. the efficiency had dropped by less than 5% for cells covered with a UV absorbing polymer film.

In summary, the above results demonstrate that the use of mixed self-assembled monolayers comprising a compacting compound together with the sensitizing dye tremedously enhances the stability of DSSCs under adverse thermal conditions. It also enhances the efficiency. The use of an amphiphilic dye provides a further improvement of stability and efficiency. Additional measures pertaining to selected components of the electrolyte co-operate with the afore-said measures to enhance the overall efficiency of the device.

The invention claimed is:

1. A regenerative photoelectrochemical cell consisting of: a photoanode, said photoanode comprising at least one semi-conductive metal oxide layer on a conductive substrate, wherein said at least one semi-conductive metal oxide layer is sensitized by an adsorbed photosensitizing dye, wherein said at least one semi-conductive metal oxide layer is directly contacted to a compound consisting only of a molecule; a counter electrode; an electrolyte arranged between said semi-conductive metal oxide layer and said counter electrode; and wherein said molecule consists of an amphiphilic compacting compound co-adsorbed with said photosensitizing dye on said semi-conductive metal oxide layer in a mixed monolayer, the amphiphilic compacting compound is a colorless, non-light absorbing, free of chromophore moiety and not electron donating species to said semi-conductive metal oxide layer, and forming the whole molecule consisting of at least one anchoring group, a hydrophobic portion and a terminal group terminating the compound, the amphiphilic compacting compound being selected from the group of compounds being one of formulae (1) to (2):

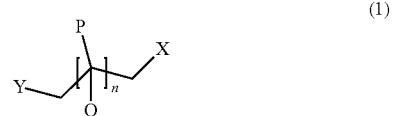

(1)

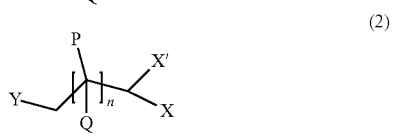

(2)

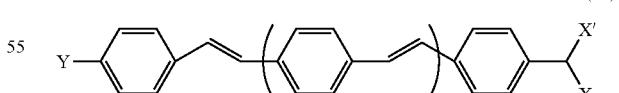

(13)

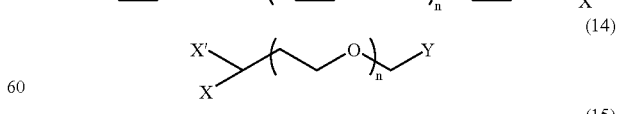

(14)

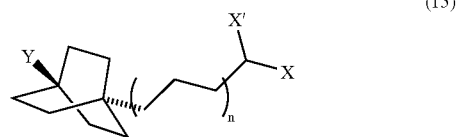

(15)

(16) 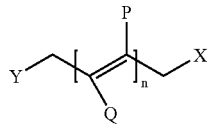

(17) 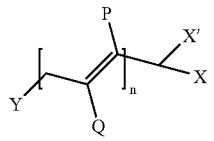

(18) 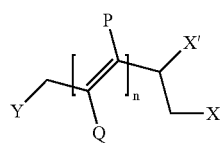

(19) 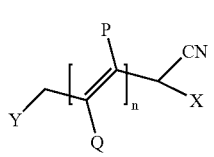

(20) 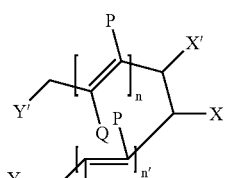

(21) 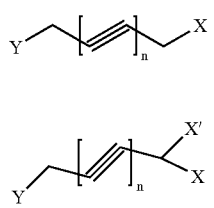

(22) 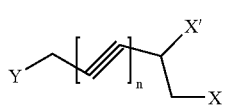

(23) 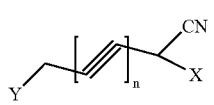

(24) 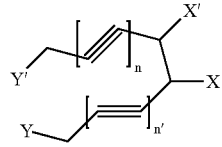

(25) 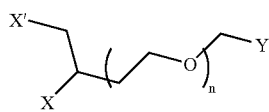

(26)

(27) 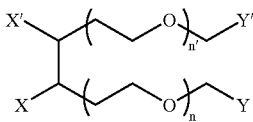

With the proviso
that P=Q=H (hydrogen)
or P=H and Q=F (fluoride)
or P=Q=F
that anchoring group X and X' are, independently one from the other, one of the groups COOH, $PO_3H_2$, $PO_4H_2$, $SO_3H_2$, $SO_4H_2$, CONHOH' and deprotonated forms thereof
that n, n' and n" designate the same or different integers from 1 to 20
that terminal group Y and Y' are, independently one from the the other, one of the groups $SO_3^-$, $CO_2^-$, $PO_3^{2-}$, $PO_3H^-$ and $CONHO^-$ or a group having one of formulae (101) to (105)

(101) 

(102) 

(103) 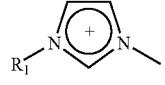

(104) 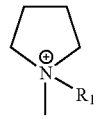

(105) 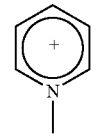

wherein $R_1$, $R_2$, $R_3$ designate independently one from the other H, a phenyl group or an alkyl group of 1 to 20 carbon atoms.

2. A cell as claimed in claim 1, characterized in that said photosensitizing dye and said compacting compound form a self-assembled mixed monolayer on said semi-conductive metal oxide layer, wherein the molar ratio of said photosensitizing dye to said co-adsorbed compacting compound is of between 10 and ½.

3. A cell as claimed in claim 2, characterized in that said self-assembled monolayer is a dense packed monolayer having an order-disorder transition temperature above 80° C.

4. The cell as claimed in claim 1, characterized in that said terminal group of the compacting compound is a neutral group selected from alkyl.

5. A cell as claimed in claim 1, characterized in that the length of said hydrophobic chain portion of the compacting compound allows said terminal group to protrude above the sensitizing dye in said monolayer.

6. The cell as claimed in claim 1, characterized in that said compacting compound is selected from the group consisting of alkyl carboxylic acids, alkyl dicarboxylic acids, alkyl carboxylates, alkyl phosphonic acids, alkyl phosphonates, alkyl diphosphonic acids, alkyl diphosphonates, alkyl sulphonic acids, alkyl sulphonates, alkyl hydroxamic acids and alkyl hydroxamates, wherein alkyl is linear or branched from C1 to C20.

7. The cell according to claim 1, characterized in that said photosensitizing dye is a ruthenium, osmium or iron complex with ligands selected from bidentate, tridentate and polydentate polypyrydil compounds and at least one anchoring group.

8. The cell according to claim 1, characterized in that said photosensitizing dye is an amphiphilic ruthenium polypyrydil complex.

9. A cell as claimed according to claim 1, characterized in that said photosensitizing dye is a Ru(II) complex of formula RuLL'(NCS)$_2$, in which L represents the ligand 4,4'-dicarboxylate-2,2'-bipyridine and L represents the ligand 4,4'-nonyl-2,2'-bipyridine.

10. The cell as claimed in claim 1, characterized in that said electrolyte comprises a redox system and said redox system comprises an electrochemically active salt and a first compound forming a redox couple with either the anion or the cation of said electrochemically active salt.

11. The cell as claimed in claim 1, characterized in that said electrolyte comprises a room temperature molten salt, said molten salt being liquid at least between standard room temperature and 80° C. above said room temperature.

12. The cell as claimed in claim 1, characterized in that said electrolyte further comprises a polar organic solvent having a boiling point of 100° C. or greater than 100° C. at normal atmospheric pressure.

13. The cell as claimed in claim 12, characterized in that said solvent is a nitrile selected from 3-methoxypropionitrile and butyronitrile.

14. A cell as claimed in claim 1, characterized in that said electrolyte further comprises, as an additive, a compound formed by a neutral molecule comprising one or more nitrogen atom(s) with a lone electron pair.

15. A cell as claimed in claim 14, characterized in that said neutral molecule has following formula:

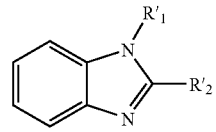

wherein R'1 and R'2 be H, alkyl, alkoxyl, alkenyl, alkynyl, alkoxyl, poly-ether, and/or phenyl, independently one from the other, the number of carbon atoms of each substituent ranging from 1 to 20, the substitute being linear or branched.

16. The cell as claimed in claim 10, characterized said electrolyte comprises an effective gelifying amount of gelifying compound.

17. The cell as claimed in claim 16, characterized in that said gelifying compound is a matrix forming polymer, said polymer being selected from the group consisting of polyvinylidenefluoride (PVDF), polyvinylidene-hexafluoro-prpopylene (PVD-HFP), polyvinylidene-hexafluoropropylene-chlorotrifluoroethylene (PVD+HFP+CTFE) copolymers, polyethylene oxide, polymethylmethacrylate, polyacrylonitrile, polypropylene, polystyrene, polybutadiene, poyethyleneglyeol, polyvinylpyrrolidone, polyani line, polypyrrole, polypyrrole, polythiophene and derivatives thereof.

18. The cell as claimed in claim 16, characterized in that said electrolyte comprises a copolymer of polyvinylidenefluoride-hexafluoropropylene (PVDF-HFP) and in that the amount of said PVDF-HFP copolymer is of between 2% and 50% by weight of the electrolyte.

* * * * *